United States Patent [19]

Adamiak et al.

[11] Patent Number: 5,809,045
[45] Date of Patent: Sep. 15, 1998

[54] DIGITAL CURRENT DIFFERENTIAL SYSTEM

[75] Inventors: Mark Gerard Adamiak, Paoli; George Edmund Alexander, Willingford, both of Pa.; William James Premerlani, Scotia, N.Y.; Emilie Thorbjorg Saulnier, Rexford, N.Y.; Birsen Yazici, Clifton Park, N.Y.

[73] Assignee: General Electric Company, Schenectady, N.Y.

[21] Appl. No.: 713,295

[22] Filed: Sep. 13, 1996

[51] Int. Cl.$^6$ ..................................................... G06F 11/34
[52] U.S. Cl. ............................................. 371/48; 364/481
[58] Field of Search ........................ 371/48, 53; 364/481, 364/483

[56] References Cited

U.S. PATENT DOCUMENTS

| 4,715,000 | 12/1987 | Premerlani | 364/484 |
|---|---|---|---|
| 5,537,327 | 7/1996 | Snow et al. | 364/483 |

FOREIGN PATENT DOCUMENTS

| 9612969 | 5/1996 | WIPO . |
|---|---|---|

OTHER PUBLICATIONS

"Charge Comparison Protection of Transmission Lines–Relaying Concepts" By Leonard J. Ernst, et al, 1992 IEEE, 92 WM 209–7 PWRD, pp. 1–9.

"Charge Comparison Protection of Transmission Lines–Communications Concepts" By Norman P. Albrecht, et al, 1992 IEEE, 92 WM 210–5 PWRD, pp. 1–7.

"High Speed Phase Segregated Line Differential Relay" By H. Peterson, ABB Inc., Canada, Paper #102, Mar. 1995 Vancouver, B.C. pp. 1–10.

"Type HCD PCM Current Differential Carrier Relay Scheme" By Mitshubishi Electric Corp., 15 Pages.

"Digital Current Differential Relay Type D2L7E" By Toshiba, pp. 1–11.

"Synchronized Phasor Measurements in Power Systems" By AG Phadke, IEEE Computer Applications In Power, Apr. 1993, pp. 10–15.

"Internet Time Synchronization: The Network Time Protocol" By David L. Mills, 1991 IEEE, pp. 91–102.

"Computer Relaying for Power Systems" By Arun Phadke, et al, 1988, Chap. 3.6–Discrete Fourier Transform–pp. 85–88, Chap 4.3–Relaying as Parameter Estimation–pp 13–129, Chap. 5.2–Power Transformer Algorithms–pp 166–176, Chap 8.9–Adaptive Relaying–pp 260–263.

*Primary Examiner*—Phung M. Chung
*Attorney, Agent, or Firm*—Ann M. Agosti; Marvin Snyder

[57] ABSTRACT

A method of detecting faults on a power transmission line system includes simultaneously measuring phase current samples at each phase of each transmission terminal; calculating real and imaginary phaselets comprising partial sums of the phase current samples; for each phaselet, calculating a respective partial sum of squares of each phase current sample; calculating the sums of the real and imaginary phaselets over a variable size sliding sample window; calculating real and imaginary phasor components from the phaselets and a sum of the partial sums of the squares over the sample window; using the sums of the real and imaginary phaselets, the real and imaginary phasor components, and the sum of the partial sums of the squares to calculate a sum of squares of errors between the phase current samples and a fitted sine wave representative of the real and imaginary phasor components; using the sum of squares of errors to calculate a variance matrix defining an elliptical uncertainty region; determining whether a disturbance has occurred, and, if so, re-initializing the sample window; and determining whether a sum of current phasors from each terminal for a respective phase falls outside of the elliptical uncertainty region for the respective phase.

19 Claims, 4 Drawing Sheets

DIGITAL CURRENT DIFFERENTIAL SYSTEM

BACKGROUND

High speed detection of faults on multi-terminal power system transmission lines has been attempted by using digital current differential measurements. Differential techniques rely on the fact that, under normal conditions for each phase, the sum of currents entering terminals equals the charging current for that phase. In one conventional digital differential current system, the procedure is to compare individual samples or use a one-cycle window, use a conventional dual slope operate-restraint characteristic, and compensate for line charging. This system is not flexible enough to operate in both high and low bandwidth communication channels. Additionally, the sensitivity of this system is low because conventional operate-restraint characteristics are not adaptive. In another conventional digital differential current system, charges are calculated at both ends of a two terminal system by integrating respective current signals and are then compared. This system has sensitivity limitations and works only for two terminal embodiments.

Many power system monitoring, protection, and control functions could be performed more efficiently and accurately if power system digital measurements at multiple locations were synchronized. Generally such measurements are only somewhat synchronized because of difficulty in accurately synchronizing sampling clocks physically separated by large distances. Conventional uses of digital communications to synchronize sampling clocks at remote locations have accuracies limited by uncertainties in the message delivery time. In particular, digital communications can have different delays in different directions between a pair of locations which lead to an error in clock synchronization.

Variable size data windows in power system protection devices have generally been avoided because of the associated complexity, computational burden, and communications requirements. Where variable size data windows have been implemented, a different set of weighting functions is used for each data window. When the data window changes size, recalculations are then required for all the samples in the data window.

Conventional power system impedance relays, including electromechanical, solid state, and digital relays, typically detect faults by calculating an effective impedance from voltage and current measurements. When the effective impedance falls within a certain range, a fault is declared. For a first zone relay, the range is typically set for less than 85–90% of the total line length impedance to allow for uncertainties in the underlying measurements of power system quantities. The actual uncertainties vary with time. Conventional impedance relays do not recognize the time varying quality of the underlying measurements, and thus sensitivity and security can be compromised.

Inherent uncertainties exist in estimating fundamental power frequency voltages and currents from digitized samples and arise from a number of sources, including, for example, power system noise, transients, sensor gain, phase and saturation error, and sampling clock error. Conventional practice is to account for these errors during system design by estimating the worst case and including enough margin to allow for the errors. The conventional procedure does not take into account the time varying nature of the errors. Other procedures to determine the sum of the squares are computationally intensive.

The standard method for providing transformer current differential protection is to develop restraint and operate signals from measured transformer currents from each winding, and to use a discrete Fourier transform (DFT) or a fast Fourier transform (FFT) to calculate various harmonics. The operate signal is usually calculated based on the principle that the sum of the ampere turns approximately equals the magnetizing current and is thus calculated as the algebraic sum of the ampere turns for each winding. The restraint signal is usually based on the fundamental frequency current or a weighted sum of the fundamental frequency current and selected harmonics to factor magnetizing inrush and overexcitation.

SUMMARY

It would be desirable to have a digital differential current system capable of operating for a wide range of bandwidth communication channels with faster response time and increased sensitivity over conventional systems.

It would also be desirable to have methods for synchronizing power system measurements at multiple locations; for calculating the fundamental power system frequency component of voltages and currents from digital data samples over a variable size data window; for calculating uncertainties from power system quantity measurements in such a manner that a reach (the setting of a distance relay) is continuously adapted to the quality of the measurements; and for determining the uncertainty in fundamental power system frequency measurements of voltages and currents by estimating the errors on-line from available information in a way that tracks the time-varying nature of the errors.

In the present invention, current measurements are transmitted by a data consolidation of a partial sum of the terms used in a discrete Fourier transform (DFT) and the required digital communications bandwidth is thereby reduced; an adaptive restraint region is automatically adjusted using statistical principles to reflect the confidence in current measurements during changing system conditions; and sampling synchronization can be achieved by analyzing data in the measured currents.

Data consolidation involves the extraction of appropriate parameters to be transmitted from raw samples of transmission line phase currents. Data consolidation can be used to achieve a balance between transient response and bandwidth requirements. Consolidation is possible along two dimensions: time and phase. Time consolidation combines a time sequence of samples to reduce the required bandwidth. Phase consolidation combines information from the three phases and the neutral. Phase consolidation is generally not used in digital systems wherein detection of which phase is faulted is desired. Time consolidation reduces communications bandwidth requirements and improves security by eliminating the possibility of falsely interpreting a single corrupted data sample as a fault. The present invention includes a new consolidation technique called "phaselets." Phaselets are partial sums of terms of a complete phasor calculation. Phaselets can be combined into phasors over any time window that is aligned with an integral number of phaselets. The number of phaselets that must be transmitted per cycle per phase is the number of samples per cycle divided by the number of samples per phaselet.

A restraint characteristic is the decision boundary between conditions that are declared to be a fault and those that are not. The present invention includes an adaptive decision process based on on-line calculation of the sources of measurement error to create an elliptical restraint region having a variable major axis, minor axis, and orientation. Parameters of the ellipse vary with time to take advantage of the accuracy of the current measurements.

With respect to synchronization, the conventional technique, as described in Mills, "Internet Time Synchronization: The Network Time Protocol," *IEEE Transactions on Communications*, vol. 39, no. 10, October 1991, pages 1482–93, is a "ping-pong" technique which uses round trip time tag messages to synchronize clocks which calculate the communications delays. A limitation of the ping-pong technique is that the difference between the delays in each direction between two terminals cannot be determined. The present invention includes a new technique for compensating for this uncertainty in the case of two or three terminal transmission lines by using information in the measured currents and digital communication. In this manner, measurement of magnitude and phase angle of power system voltages and currents at multiple locations can be performed on a common time reference. When four or more terminals are used, the conventional ping-pong technique is used.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

DETAILED DESCRIPTION

Two types of architecture can be used in the present invention: master-remote and peer-peer. Furthermore, breaker-and-a-half configurations can be used for either type of architecture, if desired.

Figure 1:
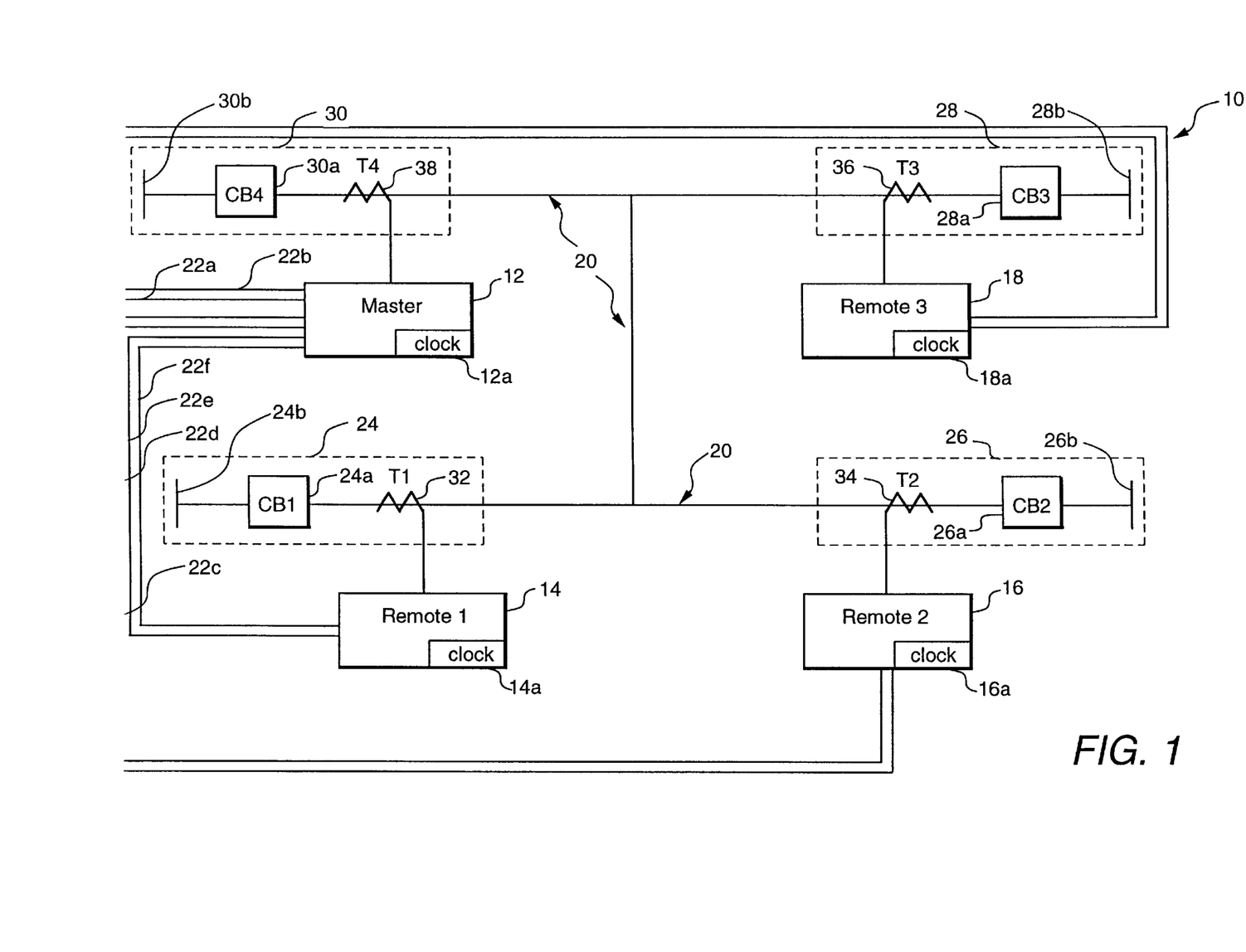
FIG. 1 is a block diagram of one transmission line protection embodiment of the present invention.

In the master-remote embodiment 10, as shown in FIG. 1, a single master device 12 (having a clock 12a) at a terminal 30 maintains synchronization of remote clocks 14a, 16a, and 18a at remote devices 14, 16, and 18 of terminals 24, 26, and 28, respectively, receives current measurement from the remote devices as well as local current, and identifies fault conditions on power line 20. Remote devices measure terminal currents using current sensors 32, 34, 36, and 38 for each phase, convert samples to phaselets, and communicate phaselet information and measurement uncertainty information with the master device along communication lines 22a, 22b, 22c, 22d, 22e, and 22f. Preferably two communication lines are present between each remote device and the master device for communication redundancy purposes. In addition to a respective current sensor, each terminal 30, 24, 26, and 28 also includes, among other components, a respective circuit breaker 30a, 24a, 26a, and 28a and a respective bus 30b, 24b, 26b, and 28b.

The master device can be physically situated anywhere in the power system. To minimize round trip communication delays, a preferred location is central to all ends of the transmission line. The master can be located near one terminal, for example. A remote device is situated at each terminal. In the case of a co-located master and remote, as shown, the functions can be combined into a single device 12.

Figure 2:
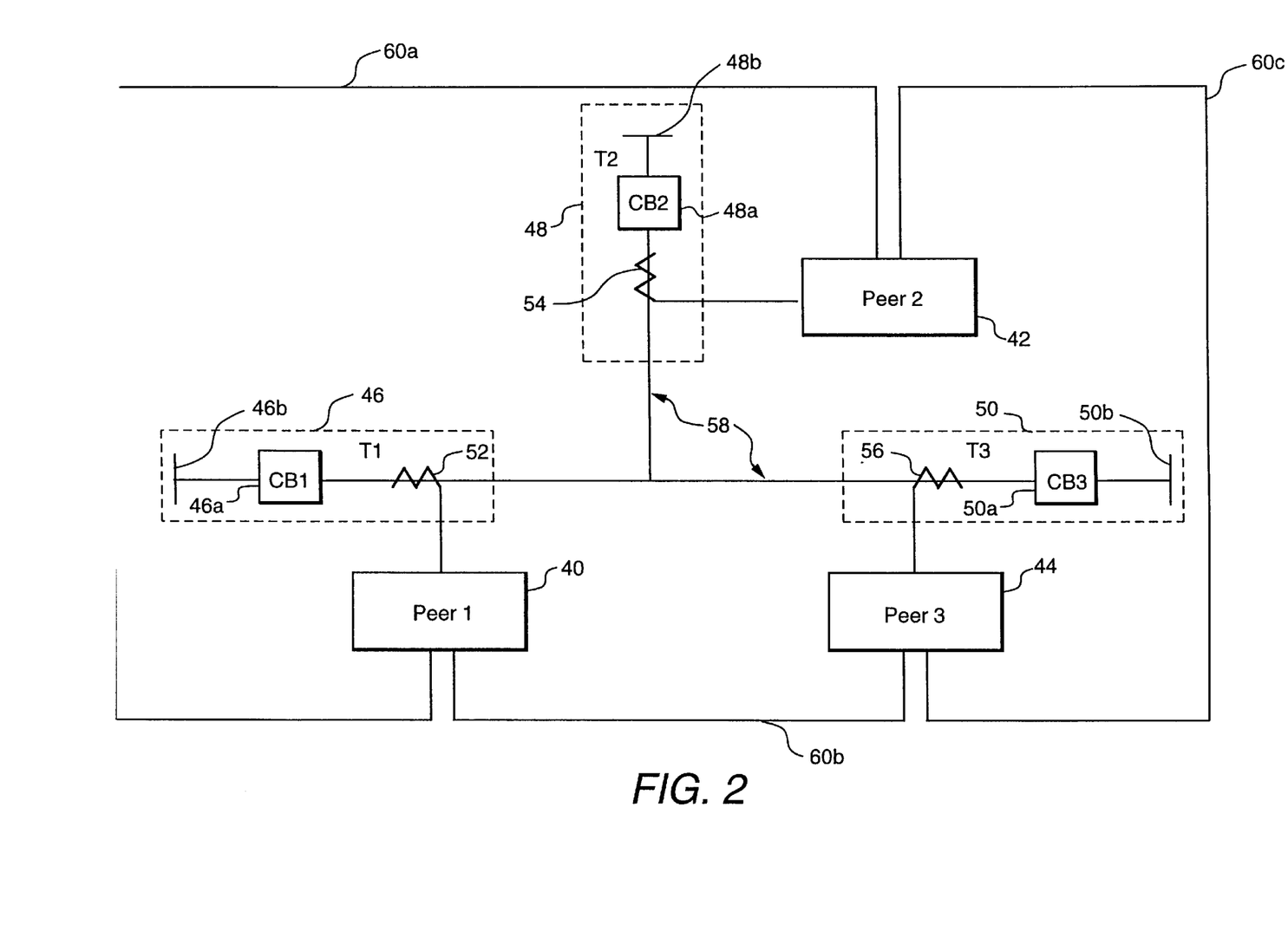
FIG. 2 is a block diagram of another transmission line protection embodiment of the present invention.

In the peer-peer embodiment, as shown in FIG. 2, a plurality of terminals 46, 48, and 50 (each including respective circuit breakers 46a, 48a, and 50a and respective buses 46b, 48b, and 50b) have power lines 58 monitored by current sensors 52, 54, and 56 of peers 40, 42, and 44, respectively. Each peer has communication lines (shown as 60a, 60b, and 60c) extending to at least some of the other peers and is adapted to perform current analysis in a manner similar to that of the master embodiment discussed above. A single communication line between each pair of peers is sufficient. Not every pair of peers requires a communication line therebetween, especially in the case of four or more terminals. The communication lines should be chosen so that the system is operable even if one of the lines fails.

At each terminal of FIG. 1 or FIG. 2, the three phase currents are sampled a number (N) of times per cycle. If desired, ground current can be derived from phase currents at the master or peer. Rough synchronization can be maintained by use of the ping-pong messaging technique. For two and three terminal systems, more accurate synchronization can be accomplished by examining the sum of the current phasors.

Decaying offset can be removed from each phase measurement using a digital simulation of a circuit commonly referred to as a "mimic circuit," which is based on the differential equation of the inductive circuit which generates the offset. Then phaselets are calculated at each terminal for each phase of the current (or, if decaying offset has been removed, from output signals of the mimic calculation), and the sum of the squares of the raw data samples is calculated for each phase.

Phaselets are combined into phasors, and ground current can be reconstructed from phase information if desired. An elliptical restraint region is determined by combining sources of measurement error. When a disturbance is detected, the variable size calculation window is readjusted to leave out pre-fault current measurements from the phasor determination.

A fault is indicated by the detection of a disturbance and by the sum of the current phasors falling outside of the elliptical restraint region. The statistical distance from the phasor to the restraint region can be an indication of the severity of the fault. To provide speed of response that is commensurate with fault severity, the distance can be filtered using a single pole low pass filter of about 60 hertz, for example. For mild faults, filtering improves measurement precision at the expense of a slight delay on the order of one cycle. Severe faults can be detected within a single phaselet.

Whenever the sum of phasors falls within the elliptical restraint region, the system assumes there is no fault, and uses whatever information is available for fine adjustment of the clocks.

Time Synchronization

In addition to being important for multi-terminal transmission lines, time synchronization is important in many other applications such as power relays, determinations of sequences of events, economic power dispatch, and any other situation requiring synchronization of clocks. The synchronization technique discussed herein can be applied to synchronize clocks at the terminals of a two or a three terminal system by examining the sum of the positive sequence currents measured at the terminals. In some situations, larger collections of clocks can then be synchronized by taking advantage of the fact that clocks at the same location can share data and be synchronized. Synchronization errors show up as phase angle and transient errors in phasor measurements at the terminal. Phase angle errors occur when identical currents produce phasors with different phase angles, and transient errors occur when currents change at the same time and the effect is observed at different times at different measurement points.

For systems having four more terminals as well as systems having two or three terminals under conditions where no current is flowing, the conventional ping-pong technique will be used. The amount of time synchronization error in the ping-pong procedure depends on factors including the stability of the local clocks, how often the ping-pong is executed, and differential channel delay. The ping-pong must be executed often enough to compensate for drifts in the local clocks. A small amount of channel delay itself is not critical (mainly affecting only system transient response) provided that the channel delay is the same in each direction between terminals. If the channel delay is not the same, the difference between the delays causes a differential error between the clocks being synchronized over the restraint boundary and reduces the system sensitivity. Thus, in the case of four or more terminals, the differential delay should be specified and controlled to achieve design goals.

In the case of two or three terminals, additional information is extracted from the current phasors to determine phase angle errors. The basis for synchronizing clocks at the termination points of a transmission line is that, according to fundamental circuit theory laws, the sum of the positive sequence currents is equal to the positive sequence charging current for the transmission lines. The positive sequence charging current can be calculated from measured voltages. Inequalities are attributable to errors in the magnitudes and/or phase angles of the estimates of the positive sequence currents. In the case of a two or a three terminal transmission line, phase angle errors, which depend on synchronization errors, can be determined approximately for each terminal.

Data sampling can additionally be synchronized to the power system frequency to eliminate the error effects of asynchronous sampling. Terminal clocks are phase locked with each other and frequency locked to the power system. The basic method of frequency locking is to calculate frequency deviation from the apparent rotation of phasors in the complex plane and adjust the sampling frequency accordingly. This calculation occurs in the master terminal for a master-remote architecture and in all terminals that serve as time and frequency references for a peer-to-peer architecture. The rotational rate of phasors is equal to the difference between the power system frequency and the ratio of the sampling frequency divided by the number of samples per cycle. This difference is used to correct the sampling clocks to synchronize the sampling with the power system frequency. The correction is calculated once per power system cycle. For conciseness, a phasor notation is used as follows:

$$\bar{I}(n) = \text{PhasorReal}_n + j \cdot \text{PhasorImaginary}_n, \quad (1)$$

$$\bar{I}_{a,k}(n) = \bar{I}(n) \text{ for phase a from the kth terminal at time step n,} \quad (2)$$

$$\bar{I}_{b,k}(n) = \bar{I}(n) \text{ for phase b from the kth terminal at time step n,} \quad (3)$$

$$\bar{I}_{c,k}(n) = \bar{I}(n) \text{ for phase c from the kth terminal at time step n.} \quad (4)$$

The positive sequence current can then be calculated for each terminal by the following equation:

$$\bar{I}_{pos,k}(n) = 1/3 \cdot \left( \bar{I}_{a,k}(n) + e^{\frac{j2\pi}{3}} \bar{I}_{b,k}(n) + e^{-\frac{j2\pi}{3}} \bar{I}_{c,k}(n) \right), \quad (5)$$

wherein n is the sample number at the kth terminal of the transmission line.

Figures 3A, 5:
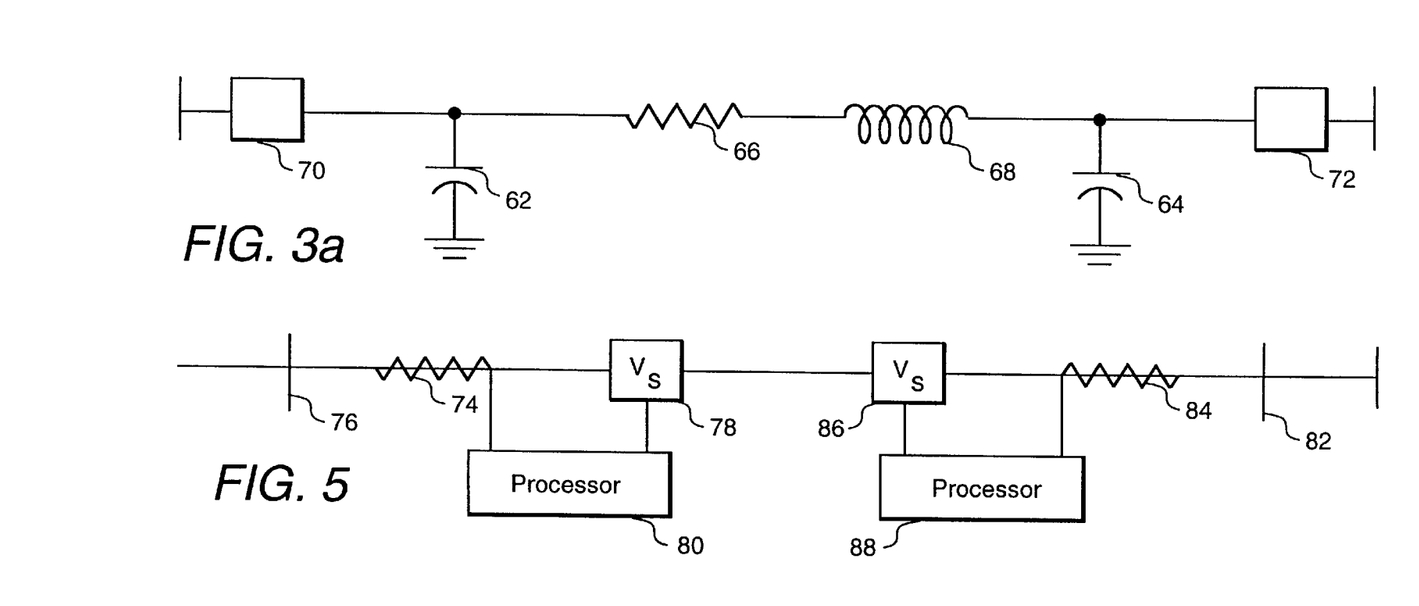
FIG. 3a is a circuit diagram of a two-terminal, single phase, equivalent line charging model.
FIG. 5 is a circuit diagram of a distance relay.

The contribution of charging currents can be removed at each respective terminal by subtraction. FIG. 3a illustrates a two-terminal, positive sequence, equivalent line charging model, and FIG. 3b illustrates the three phase charge compensation model for a terminal.

In the case of a power system transmission line having line resistance 66 and inductance 68, the sum of the currents entering terminals 70 and 72 is not exactly zero because of the capacitive charging current for the line. For short transmission lines, the charging current can be treated as an unknown error. In these embodiments, no voltage sensors are needed, and line charging current is included as a constant term in the total variance (discussed with respect to equation 37 below), thereby increasing the restraint of the system to compensate for the line charging current.

For long transmission lines, the charging current can become significant and compromise the sensitivity of the differential algorithm, so charging current compensation using voltage measurements is beneficial. One technique for such compensation is to subtract a C dv/dt term (capacitance 62 or 64 multiplied by the change in voltage over time) from the measured current at each terminal of the system. This technique provides compensation of the capacitive current at both the fundamental power system frequency and some of the frequencies of the transient response of the transmission line. The fine details of traveling waves on the transmission line are not compensated for, and they contribute to the restraint by increasing the sum of the squares of the errors in the data samples. Although a model for compensation for a two terminal system is shown, the model can be extended to accommodate any number of terminals.

Figure 3B:
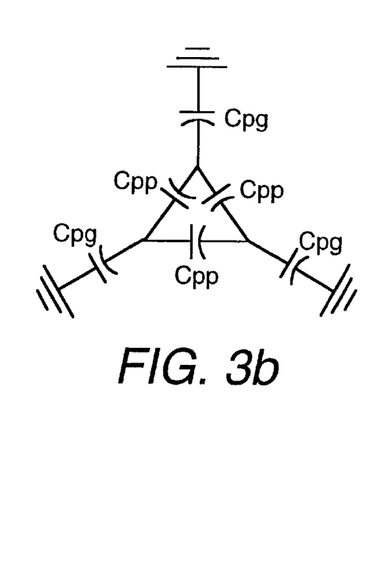
FIG. 3b illustrates a three phase charge compensation model for a terminal.

When three phase models are used, as shown in FIG. 3b, both phase to phase capacitance (Cpp) and phase to ground capacitance (Cpg) must be analyzed. In terms of zero sequence and positive sequence capacitance, Cpg and Cpp are given by Cpg=Czero (zero sequence capacitance) and Cpp=⅓ Cplus (positive sequence capacitance) minus ⅓ Czero. The compensation technique for each phase can use data from all three phases. For example, the compensation for phase "a" can be provided by Cpg*dVa/dt+Cpp*(2*dVa/dt−dVb/dt−dVc/dt), wherein Va, Vb, and Vc are phase voltages. Another equivalent expression for the phase "a" charging current is Cplus*(dVa/dt−dVo/dt)+Czero*dVo/dt, wherein Vo is the zero sequence voltage.

For some very long lines, the distributed nature of the lines lead to the classical transmission line equations, which can be solved for voltage and current profiles along the line. The compensation model uses the effective positive and zero sequence capacitance seen at the terminals of the line.

In some applications with long transmission lines, shunt reactors can be used to provide some of the charging current required by the line. The shunt reactors reduce the amount of charging current seen by the differential system at the fundamental power system frequency. Additionally, the shunt reactors interact with the charging capacitance to introduce additional frequency components in the transient response of the transmission line. In one embodiment, the protection charging compensation is set to equal the residual charging current (the difference of capacitive and inductive reactance) at the fundamental power system frequency. The inductor current can be effectively "removed" from the circuit via a current transformer connection (not shown).

The basic procedure for achieving improved phase synchronism is to make small adjustments in the sampling clocks to drive the sum of current phasors toward zero. Because synchronization error affects all three phases, these adjustments can be based on positive sequence currents.

In the case of a two terminal system, the clock phase angle corrections ($\phi_1(n), \phi_2(n)$) are calculated from the positive sequence currents as follows:

$$\phi_1(n) = \frac{1}{2} \cdot \arctan\left( \frac{imag(\bar{I}_{pos,2}(n) \cdot \bar{I}^*_{pos,1}(n))}{real(\bar{I}_{pos,2}(n) \cdot \bar{I}^*_{pos,1}(n))} \right), \quad (6)$$

and $$\phi_2(n) = -\phi_1(n). \quad (7)$$

It is possible to use a four quadrant arc tangent, in which case the minus signs are needed on the imaginary and real part as shown.

In the case of a three terminal system, the corrections ($\phi_1(n), \phi_2(n), \phi_3(n)$) are approximated by the following equations:

$$\phi_1(n) \approx \frac{real((\bar{I}_{pos,2}(n) - \bar{I}_{pos,3}(n)) \cdot (\bar{I}^*_{pos,1}(n) + \bar{I}_{pos,2}(n) + \bar{I}^*_{pos,3}(n)))}{imag(\bar{I}_{pos,2}(n) \cdot \bar{I}^*_{pos,1}(n) + \bar{I}_{pos,3}(n) \cdot \bar{I}^*_{pos,2}(n) + \bar{I}_{pos,1}(n) \cdot \bar{I}^*_{pos,3}(n))}, \quad (8)$$

$$\phi_2(n) \approx \frac{real((\bar{I}_{pos,3}(n) - \bar{I}_{pos,1}(n)) \cdot (\bar{I}^*_{pos,1}(n) + \bar{I}_{pos,2}(n) + \bar{I}^*_{pos,3}(n)))}{imag(\bar{I}_{pos,2}(n) \cdot \bar{I}^*_{pos,1}(n) + \bar{I}_{pos,3}(n) \cdot \bar{I}^*_{pos,2}(n) + \bar{I}_{pos,1}(n) \cdot \bar{I}^*_{pos,3}(n))}, \quad (9)$$

$$\phi_3(n) \approx \frac{real((\bar{I}_{pos,1}(n) - \bar{I}_{pos,2}(n)) \cdot (\bar{I}^*_{pos,1}(n) + \bar{I}_{pos,2}(n) + \bar{I}^*_{pos,3}(n)))}{imag(\bar{I}_{pos,2}(n) \cdot \bar{I}^*_{pos,1}(n) + \bar{I}_{pos,3}(n) \cdot \bar{I}^*_{pos,2}(n) + \bar{I}_{pos,1}(n) \cdot \bar{I}^*_{pos,3}(n))}. \quad (10)$$

The phase angle corrections are filtered to slowly adjust the clocks at each terminal until the phase angle corrections are driven toward zero in a closed loop technique. This adjustment of the phase angles can occur either by itself or in combination with the frequency synchronization technique discussed below.

For each terminal, a quantity can be derived from the positive sequence current (with or without removal of the charging current—depending on the application) that is indicative of the amount of rotation from one cycle to the next by calculating the product of the positive sequence current and the complex conjugate of the positive sequence current from the previous cycle:

$$\text{Deviation} = \bar{I}_{pos,k}(n) \cdot (\bar{I}_{pos,k}(n-N))^*. \quad (11)$$

The angle of the deviation phasor per cycle for each terminal is proportional to the frequency deviation at that terminal, as discussed in commonly assigned Premerlani, U.S. Pat. No. 4,715,000, issued Dec. 22, 1987. Because the clock synchronization method maintains frequency synchronism, the frequency deviation is the same for each terminal. Therefore, the deviation phasors from all of the terminals can be added to obtain a net deviation phasor for the system:

$$\text{Deviation}(n) = \sum_{k=1}^{NT} \text{Deviation}_k(n), \quad (12)$$

wherein NT is the number of terminals. The deviation phasors are filtered to reduce the effects of noise and control the transient behavior of the adaptation process. Then the sampling deviation frequency is calculated from the filtered deviation phasor Deviationf(n):

$$\frac{\Delta f}{f_o} = \arctan\left( \frac{imag(\text{Deviation}f(n))}{real(\text{Deviation}f(n))} \right) \quad (13)$$

wherein $\Delta f$ is the frequency deviation and $f_o$ is the nominal frequency. A four quadrant arc tangent can be calculated by taking the imaginary and the real part of the deviation separately for the two arguments of the four quadrant arc tangent. The sampling clocks of the terminals can be adjusted to drive the sampling frequency deviation toward zero.

Data Consolidation

The fundamental power system frequency voltages and currents are calculated from digitized samples of voltages and currents with a minimized computational burden and a data window which can have variable sizes. In applications requiring the communication of voltage and current information, the method is particularly efficient with respect to communication bandwidth requirements. This invention can be used in digital devices that measure fundamental frequency voltage or current components.

The data compression minimizes the sum of the squares of the errors between data samples and a sinusoidal waveform that best approximates the data samples. In the case of a fixed size data window that is an integral multiple of a half cycle, a discrete Fourier transform (DFT) which can be modified for use according to the present invention. For a variable size data window, a modified DFT presents problems such as the calculation of a complex amplitude from a weighted sum of the data samples when the weights of individual samples depend on the width of the data window, as well as the accompanying bandwidth requirements.

The "phaselet" technique of the present invention partitions the calculation into two processes. The first process is a calculation of partial sums of the data samples multiplied by one cycle weights. The second process is a summation of the partial sums over the width of the desired data window and a correction for distortion caused by the one cycle weights.

The partial sums (phaselets) are calculated by multiplying each data sample by a corresponding complex factor that does not depend on the data window, and then adding the results over several data cycles. In applications requiring communications of complex amplitudes, phaselets are communicated as they are calculated. The number of samples in a phaselet can be selected to achieve whatever compromise is desired between communications bandwidth requirements and transient response. A large number of samples per phaselet reduces communications bandwidth. A small number of samples per phaselet reduces transient response.

Phaselets are converted into complex amplitudes over any size data window by adding the phaselets in that window and multiplying by precalculated factors for that particular window.

More specifically, a phaselet is a portion of the sine and cosine weighted sum of data samples. Over a half cycle, a phasor is calculated from phaselets by simply adding phaselets and multiplying by 4/N. For window sizes other than a half cycle or multiple of a half cycle, a phasor is calculated by adding phaselets over the window and then multiplying a normalization two-by-two real matrix by the real and imaginary portions of the sum of phaselets.

Phasors are represented as real and imaginary components. The real component represents the cos (ωt) term, and the imaginary components represent minus the sin (ωt) term. The convention used herein is to represent all phasor quantities as peak values. To convert to arms, divide by the square root of two.

In the following equations, all indexes in summations increment by 1 from the lower limit of the summation up to an including the upper limit. Counting of samples, phaselets, and cycles starts from 1, which is assumed to be the time reference t=0. The arguments of the cosine and sine functions are offset by ½ the sampling angle. The first coefficient, for time t=0, integer index (k) count=1, is for a phase angle of ½ the sampling angle. Sampling occurs at the rate of N samples per cycle, where the choice of N depends on the particular application. Phaselets are calculated every P data samples, where the choice of P depends on the application requirements. Phasors are updated whenever new phaselets are available. In the case of a ½ cycle sliding window, a fixed number of phaselets are added to produce a phasor. When a variable window is used, the number of phaselets is proportional to the window size.

A phaselet is a sum of sine and cosine weighted samples over a fraction of a cycle. An appropriate way to extract 16 phasor values per cycle from 64 samples per cycle is to first calculate sine and cosine weighted sums of groups of 4 samples per group. A DFT over a ½ cycle could be calculated by adding phaselets over the ½ cycle and multiplying by a suitable factor. For other size windows, a DFT is calculated by adding phasors and multiplying by an appropriate matrix that depends on the width and phase angle of the window.

Phaselets are calculated as follows:

$$\text{PhaseletReal}_p = \sum_{k=p \cdot P-P+1}^{p \cdot P} \cos\left(\frac{2 \cdot \pi}{N} \cdot \left(k - \frac{1}{2}\right)\right) \cdot x_k, \quad (14)$$

and $$\text{PhaseletImaginary}_p = -\sum_{k=p \cdot P-P+1}^{p \cdot P} \sin\left(\frac{2 \cdot \pi}{N} \cdot \left(k - \frac{1}{2}\right)\right) \cdot x_k, \quad (15)$$

wherein
PhaseletReal$_p$=the real part of the pth phaselet for signal x,
Phaseletimaginary$_p$=the imaginary part of the pth phaselet for x,
p=phaselet index; there are N/P phaselets per cycle,
P=number of samples per phaselet,
N=number of samples per cycle,
X$_k$=kth sample of signal x, taken at N samples per cycle.

The argument to the cosine and sine function in equations 14 and 15 is offset by ½ the sampling angle for simplifying the calculation of the matrices needed to convert phaselets into phasors and simplifying an optional process for correcting for a small error in the sampling frequency.

Various numbers of phaselets can be combined to form a sliding window DFT. For a ½ cycle DFT, for example, the process for calculating phasors from phaselets is adding phaselets and multiplying by 4/N:

$$\text{PhasorReal}_n = \frac{4}{N} \cdot \left( \sum_{p=n-\frac{N}{2 \cdot P}+1}^{n} \text{PhaseletReal}_p \right), \quad (16)$$

and $$\text{PhasorImaginary}_n = \frac{4}{N} \cdot \left( \sum_{p=n-\frac{N}{2 \cdot P}+1}^{n} \text{PhaseletImaginary}_p \right), \quad (17)$$

wherein n represents the phasor index (there are N/P phasors per cycle).

It is possible to perform the sums recursively in fixed point arithmetic without fear of accumulated round off errors, provided that the multiplications are performed on a sample by sample basis. After initialization, the sums at one value of n are calculated from the previous sums by adding the newest terms of the new sums and subtracting the oldest terms of the old sums.

Converting phaselets into phasors can also be done for other window sizes by adding phaselets and then multiplying by a phaselet transformation matrix. First the phaselets are added together over the desired window:

$$\text{PhasorSumReal}_n = \sum_{p=n-\frac{W}{P}+1}^{n} \text{PhaseletReal}_p, \quad (18)$$

and $$\text{PhasorSumImaginary}_n = \sum_{p=n-\frac{W}{P}+1}^{n} \text{PhaseletImaginary}_p, \quad (19)$$

wherein W=window size in samples, and W/P is window size in phaselets.

Optionally, these sums can be calculated recursively. As discussed above, the sums at one value of n can be calculated from the previous sums by adding the newest terms of the new sums and subtracting the oldest terms of the old sums. Sums are then converted into phasors by multiplying by the following matrix:

$$\begin{bmatrix} \text{PhasorReal}_n \\ \text{PhasorImaginary}_n \end{bmatrix} = \begin{bmatrix} T_{RR}(n, W) & T_{RI}(n, W) \\ T_{RR}(n, W) & T_{II}(n, W) \end{bmatrix} \cdot \begin{bmatrix} \text{PhaseletSumReal}_n \\ \text{PhaseletSumImaginary}_n \end{bmatrix} \quad (20)$$

wherein

-continued $$T_{RR} = \left(\left(1 - \left(\frac{1}{W} \cdot \cos\left(\frac{4 \cdot \pi \cdot P \cdot n}{N} - \frac{2 \cdot \pi \cdot W}{N}\right) \cdot \frac{\sin\left(\frac{2 \cdot \pi \cdot W}{N}\right)}{\sin\left(\frac{2 \cdot \pi}{N}\right)}\right)\right)\right) \cdot \frac{2}{W - \frac{\left(\sin\left(\frac{2 \cdot \pi \cdot W}{N}\right)\right)^2}{W \cdot \left(\sin\left(\frac{2 \cdot \pi}{N}\right)\right)^2}} \quad (21)$$

$$T_{RI} = T_{IR} = \frac{1}{W} \cdot \sin\left(\frac{4 \cdot \pi \cdot P \cdot n}{N} - \frac{2 \cdot \pi \cdot W}{N}\right) \cdot \frac{\sin\left(\frac{2 \cdot \pi \cdot W}{N}\right)}{\sin\left(\frac{2 \cdot \pi}{N}\right)} \cdot \frac{2}{W - \frac{\left(\sin\left(\frac{2 \cdot \pi \cdot W}{N}\right)\right)^2}{W \cdot \left(\sin\left(\frac{2 \cdot \pi}{N}\right)\right)^2}} \quad (22)$$

$$T_{II} = \left(\left(1 + \left(\frac{1}{W} \cdot \cos\left(\frac{4 \cdot \pi \cdot P \cdot n}{N} - \frac{2 \cdot \pi \cdot W}{N}\right) \cdot \frac{\sin\left(\frac{2 \cdot W}{N}\right)}{\sin\left(\frac{2 \cdot \pi}{N}\right)}\right)\right)\right) \cdot \frac{2}{W - \frac{\left(\sin\left(\frac{2 \cdot \pi \cdot W}{N}\right)\right)^2}{W \cdot \left(\sin\left(\frac{2 \cdot \pi}{N}\right)\right)^2}} \quad (23)$$

The matrix thus depends on design constants P and N and variables W and n. In principle, a matrix should be calculated for each combination of n and W.

Until a disturbance is detected, phaselets will be combined to form a sliding window DFT. After a disturbance is detected, the window is re-initialized by removing the previously calculated phaselets from the current window and then expanding the current window as new data is gathered to reform a sliding window DFT. In this manner, the more relevant disturbance information is not diluted by the presence of earlier obtained normal information.

Removal of Decaying Offsets

In some applications decaying offset can occur and create errors which interfere with the determination of how well the measured current samples fit a sine wave. For example, the inductive behavior of power system transmission lines gives rise to decaying exponential offsets during transient conditions.

A mimic algorithm can be used to remove decaying offsets as follows:

$$Imimic_m = \frac{R}{\cos\left(\frac{\pi \cdot M}{N}\right)} \cdot \frac{(i_m + i_{m-M})}{2} + \frac{X}{\sin\left(\frac{\pi \cdot M}{N}\right)} \cdot \frac{(i_m - i_{m-M})}{2}, \quad (24)$$

wherein
$Imimic_m$ = mth sample of the output of the mimic algorithm,
$i_m$ = mth current sample,
m = sample index, starting from 1, at N samples per cycle,
M = interval, in samples, used to approximate the mimic simulation,
N = sampling rate, samples per cycle,
X = reactance of the mimic,
R = resistance of the mimic.

A similar equation can be used for voltage samples. Transient response of the mimic is M samples, at N samples per cycle. Using M=4 and N=64, transient response is 1 millisecond.

Next the phaselets are calculated in the same manner as equations 14 and 15 with the substitution of $Imimic_k$ for $x_k$ as follows:

$$PhaseletReal_p = \sum_{k=p \cdot P-P+1}^{p \cdot P} \cos\left(\frac{2 \cdot \pi}{N} \cdot \left(k - \frac{1}{2}\right)\right) \cdot Imimic_k, \quad (25)$$

and $$PhaseletImaginary_p = \quad (26)$$

$$\sum_{k=p \cdot P-P+1}^{p \cdot P} -\sin\left(\frac{2 \cdot \pi}{N} \cdot \left(k - \frac{1}{2}\right)\right) \cdot Imimic_k,$$

wherein $Imimic_m$ = mth sample of the output of the mimic algorithm.

In order to calculate statistical parameters, the sum of the squares of individual samples is also calculated:

$$PartialSumOfSquares_p = \sum_{k=p \cdot P-P+1}^{p \cdot P} Imimic_k^2. \quad (27)$$

As discussed above, until a disturbance is detected, phaselets will be combined to form a sliding window DFT, and after a disturbance is detected, the window is reinitialized by removing the previously calculated phaselets from the current window and then expanding the current window as new data is gathered to reform a sliding window DFT.

A sliding window DFT can be of a one half cycle as discussed above or a multiple of one half as discussed here is with respect to the one cycle sliding window. A one half cycle window provides a faster transient response but does not have as high an accuracy as a one cycle window.

For a one cycle DFT, the process for calculating phasors from phaselets and the sum of squares form partial sums is simple, as shown in the following equations:

$$PhasorReal_n = \frac{2}{N} \cdot \left(\sum_{p=n-\frac{N}{P}+1}^{n} PhaseletReal_p\right), \quad (28)$$

and $$\text{PhasorImaginary}_n = \frac{2}{N} \cdot \left( \sum_{p=n-\frac{N}{P}+1}^{n} \text{PhaseletImaginary}_p \right), \quad (29)$$

wherein

PhasorReal$_n$=the real part of the nth phasor,

PhasorImaginary$_n$=the imaginary part of the nth phasor, n=phasor index; there are N/P phasors per cycle.

In order to calculate statistical parameters, the sum of the squares of individual samples is also calculated:

$$\text{SumOfSquares}_n = \sum_{p=n-\frac{N}{P}+1}^{n} \text{PartialSumOfSquares}_p, \quad (30)$$

wherein SumOfSquares$_n$=the nth sum of squares.

The above equations are defining. The sums involved are not actually calculated in the order shown, but are calculated recursively. After initialization, the sums at one value of n are calculated from the previous sums by adding the newest terms of the new sums and subtracting the oldest terms of the old sums which would fall outside the current window.

As discussed above, converting phaselets to phasors can also be done for other window sizes by adding phaselets and then multiplying by a normalization matrix. First the phaselets are added together over the desired window using equations 18 and 19 to obtain PhaseletSumReal$_n$ and PhaseletSumImaginary$_n$. Then the sum of the squares is calculated as follows:

$$\text{SumOfSquares}_n = \sum_{p=n-\frac{N}{P}+1}^{n} \text{PartialSumOfSquares}_p. \quad (31)$$

Phaselets sums are converted into phasors by multiplying by the precalculated matrix discussed with respect to equations 20 through 23.

Sum of the Squares of Errors Between Measured Data Samples and the Fitted Sine Wave Although the sum of the squares of errors is discussed herein in the context of multi-terminal transmission lines, other applications in which the invention an be useful include, for example, motor protection, control and diagnostic devices such as turn fault detectors, power system relays such as distance, transformer, bus, and generator relays, industrial protective devices, and drive systems.

The sum of squares of the errors between measured data samples and the fitted sine wave can be calculated from the sum of squares, the phaselets, and the phasors as follows:

$$E_n^2 = \quad (32)$$

$$\text{SumOfSquares}_n - \left( \begin{array}{l} \text{PhaseletSumReal}_n \cdot \text{PhasorReal}_n + \\ \text{PhaseletSumImaginary}_n \cdot \text{PhasorImaginary}_n \end{array} \right).$$

This method for calculating the sum of the squares of the errors is valid for any size data window. The methods used in the prior art either require more calculation or are valid only for data windows that are integral numbers of a half cycle.

The equation for the squared error $E_n^2$ is particularly efficient because it requires only two multiplies and three additions. When phaselets are already being calculated for data consolidation purposes, the only extra calculations will be the sum of the squares. All three sums (of phaselet real, phaselet imaginary, and squares) can be calculated recursively for a sliding window, even as the window changes size. Once a sum for a value of n is calculated, the value of the sum for the next value of n can be calculated by adding the newest terms and subtracting the oldest terms. For the equation to be applied properly in fixed point arithmetic, enough bits must be used to hold squared values, and care must be taken with the scaling. Both the sum of the squares and the phaselet sums are proportional to the number of samples in the window.

Figure 4:
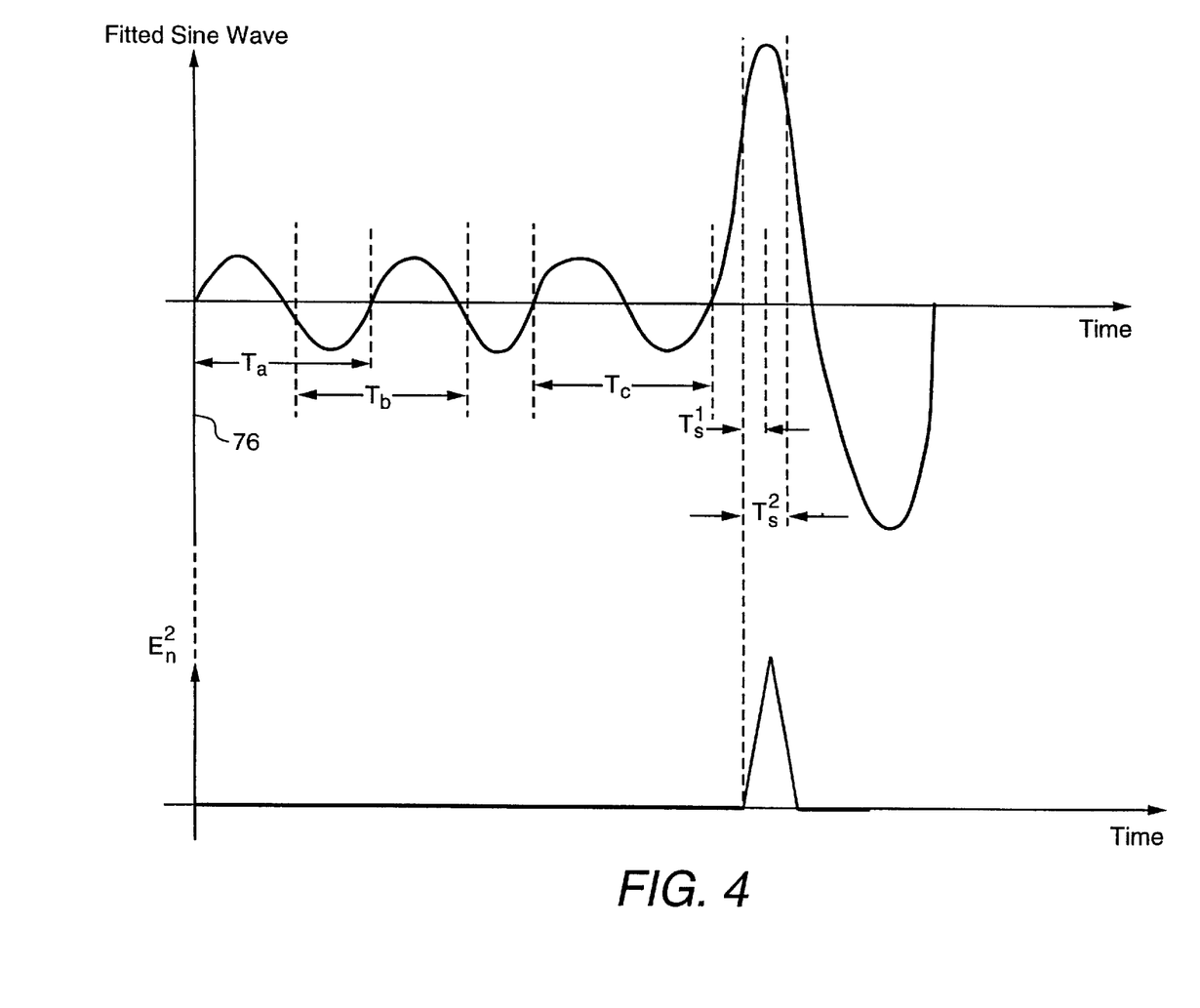
FIG. 4 is a graph of a fitted sign wave and the sum of the squares of the errors between the measured data samples and the fitted sign wave with respect to time.

FIG. 4 is a graph illustrating a fitted sign wave representative of the phasors, and the sum of squares of the errors ($E_n^2$), with respect to time. A one cycle sliding window is represented at different points in time by $T_a$, $T_b$, and $T_c$. At point $T_s^1$, a disturbance is detected and is reflected by a spike in the sum of squares of the errors. When such disturbance condition is detected, the sliding window is re-initialized. A new window, $T_s^1$ (including only one phaselet), begins and does not include any previous phaselet information. As new samples and phaselets are calculated, the new window expands. For example, after the next phaselet is calculated the new window, $T_s^2$, includes two phaselets. The window continues to expand with newly calculated phaselets until a one cycle window is formed. At this point the window begins to slide again by adding the new terms and dropping the oldest terms.

The sum of the squares of the errors is a sensitive disturbance detection indicator. Other potential disturbance conditions such as magnitude above a threshold of positive sequence current, negative sequence current, or ground current or changes in positive, negative, or zero sequence current or load current can be monitored and compared to respective thresholds to detect disturbances, if desired, in addition to calculating the sum of the squares of the errors.

By itself, the two-norm equation 32 is only an indication of the sum of the squares of the sample errors. A more useful quantity is an estimate of the standard deviation of the samples:

$$\sigma_n = \sqrt{\frac{E_n^2}{W}}, \quad (33)$$

wherein W is the window size in samples. The variance matrix for a variable window is given by:

$$\begin{bmatrix} C_{RR(n,W)} & C_{RI(n,W)} \\ C_{IR(n,W)} & C_{II(n,W)} \end{bmatrix} = \sigma_n^2 \cdot \left( \begin{bmatrix} T_{RR(n,W)} & T_{RI(n,W)} \\ T_{IR(n,W)} & T_{II(n,W)} \end{bmatrix} \right) = \quad (34)$$

$$\frac{E_n^2}{W} \cdot \left( \begin{bmatrix} T_{RR(n,W)} & T_{RI(n,W)} \\ T_{IR(n,W)} & T_{II(n,W)} \end{bmatrix} \right)$$

wherein $T_{RR(n,W)}$, $T_{RI(n,W)}$, $T_{IR(n,W)}$, & $T_{II(n,W)}$ are defined by equations 21–23, $C_{RR}$=expected value of square of error in real part of a phasor, $C_{RI}$=$C_{IR}$=expected value of product of errors in the real & imaginary, parts, $C_{II}$=expected value of square of error in imaginary part of a phasor.

The variance matrix in a phasor measurement is the square of the sample deviations times the transformation matrix given previously. This matrix describes an elliptical uncertainty region in general, although for windows that are integer multiples of a half cycle, the off diagonal terms are zero and the real and imaginary elements are the same. Strictly speaking, the uncertainty of a phasor measurement should be evaluated in light of the full matrix. However, a worst case condition can be considered to simplify the calculations. If a phasor happens to have a particular phase angle, it will maximize the uncertainty in its magnitude.

The above description relates to the communication and analysis of three phase data. If less baud is available as would be the situation in a 9600 baud system, for example, then a positive sequence current phasor and variance matrix information of each respective terminal can be transmitted once per cycle for all three phases. The magnitude of the factor multiplying each phase current in the computation of positive sequence current is 1/3, so the net variance in the positive sequence current is 1/9 times the sum of the variance parameters for each phase.

Although the positive sequence current is the preferred parameter for transmission, either the zero sequence current or the negative sequence current could alternatively be used. The zero ($I_0$), positive ($I_+$), and negative ($I_-$) sequence currents can be calculated as follows.

$$I_0 = (1/3)^*(I_A + I_B + I_C) \tag{34a}$$

$$I_+ = (1/3)^*(I_A + e^{j2/3}I_B + e^{j4/3}I_C) \tag{34b}$$

$$I_- = (1/3)^*(I_A + e^{j4/3}I_B + e^{j2/3}I_C), \tag{34c}$$

wherein $I_A$, $I_B$, and $I_C$ represent current phasors obtained from the measured phase currents.

A positive sequence sum of the squares $E_+$ can be calculated from the sums of the squares ($E_A$, $E_B$, $E_C$) of the phases as follows:

$$E_+ = 1/9(E_A^2 + E_B^2 + E_C^2). \tag{34d}$$

The terms in the variance matrix ($C_{RR+}$, $C_{RI+}$, $C_{IR+}$, $C_{II+}$). can thus be calculated from the variance matrix terms for the individual phases A, B, and C:

$$C_{RR+} = 1/9(C_{RR}(n,W,A) + C_{RR}(n,W,A) + C_{RR}(n,W,A)), \tag{34)}$$

$$C_{RI+} = C_{IR+} = 1/9(C_{RI}(n,W,A) + C_{RI}(n,W,A) + C_{RI}(n,W,A)), \tag{34f}$$

$$C_{II+} = 1/9(C_{II}(n,W,A) + C_{II}(n,W,A)_B + C_{II}(n,W,A)). \tag{34g}$$

The positive sequence current and the three variance parameters can be transmitted from each terminal for analysis.

Distance Relay Reach

FIG. 5 is a circuit diagram of a distance relay including terminals 76 and 82, current sensors 74 and 84, voltage sensors 78 and 86, and processors 80 and 88. Conventional distance relays operate by measuring voltage and current at one end of a line to calculate effective impedance, which is proportional to line length. Conventional distance relay applications and techniques are discussed, for example, in Phadke and Thorp, *Computer Relaying for Power Systems* (Research Studies Press LTD. and John Wiley & Sons Inc. 1988).

Line length impedance can be determined under short circuit conditions. The effective impedance is used to determine a fault location by setting a reach (a percentage of the line length impedance), comparing the effective impedance to the reach, and declaring a fault condition if the effective impedance is less than the reach. Conventional power system impedance relays use a reach, for a first zone relay, which is typically set for less than 80–90% of the total line length impedance to allow for uncertainties in the underlying measurements of power system quantities.

The actual uncertainties vary with time, however. Because conventional impedance relays do not recognize the time varying quality of the underlying measurements, sensitivity and security can be compromised. For example, during transient start up periods of the relay, a low reach is appropriate, and during period with low uncertainties, a reach higher than 90% can be desirable.

In the present invention, for a particular standard deviation $\sigma_n$, as determined in equation 33, a deviation $\Delta_n$ (uncertainty) in a nominal reach is given by:

$$\Delta_n = \sigma_n \cdot \sqrt{\frac{2}{W - \frac{\sin\left(\frac{2 \cdot \pi \cdot W}{N}\right)}{\sin\left(\frac{2 \cdot \pi}{N}\right)}}} \tag{35}$$

The deviation can be normalized by the following equation:

$$\Delta_{normalized} = \sqrt{\frac{\sigma_V^2}{V^2} + \frac{\sigma_I^2}{I^2}} \cdot \sqrt{\frac{2}{W - \frac{\sin\left(\frac{2 \cdot \pi \cdot W}{N}\right)}{\sin\left(\frac{2 \cdot \pi}{N}\right)}}} \tag{35a}$$

$$= \sqrt{\frac{E_V^2}{W \cdot V^2} + \frac{E_I^2}{W \cdot I^2}} \cdot \sqrt{\frac{2}{W - \frac{\sin\left(\frac{2 \cdot \pi \cdot W}{N}\right)}{\sin\left(\frac{2 \cdot \pi}{N}\right)}}},$$

wherein $\Delta_{normalized}$ is the normalized deviation, $\sigma_V$ is the standard deviation of voltage V, $\sigma_I$ is the standard deviation of current I, $E_V$ is the sum of squares of errors between phase voltage samples and a fitted sign wave representative of corresponding real and imaginary phasors, and $E_I$ is the sum of squares of errors between phase current samples and a fitted sign wave representative of corresponding real and imaginary phasors.

The normalized deviation can be multiplied by a factor related to the confidence interval (such as the number of standard deviations) and the assumed distribution of the error to obtain an uncertainty percentage. One example factor is four (4). The uncertainty percentage can be subtracted from one (1) with the result being multiplied by the nominal reach to obtain an adjusted reach. The adjusted reach can be multiplied by the predetermined line impedance to obtain an adjusted impedance value for comparison with the effective impedance.

Fault Severity of Differential System

Normally the sum of the current phasors from all terminals is zero for each phase. A fault is detected for a phase when the sum of the current phasors from each terminal for that phase falls outside of a dynamic elliptical restraint boundary for that phase, based on statistical analysis. The severity of the fault is calculated from the covariance parameters and the sum of the current phasor for each phase as follows:

$$\text{Severity} = \text{PhasorReal}^2 \cdot \sqrt{\frac{C_{II}}{C_{RR}}} - \text{PhasorReal} \cdot \tag{36}$$

-continued
$$\text{PhasorImaginary} \cdot 2 \cdot \frac{C_{RI}}{\sqrt{C_{RR} \cdot C_{II}}} +$$

$$\text{PhasorImaginary}^2 \cdot \sqrt{\frac{C_{RR}}{C_{II}}} - 18 \cdot \text{Restraint}^2 \cdot$$

$$\sqrt{C_{RR} \cdot C_{II}} \cdot \left(1 - \frac{C_{RI}^2}{C_{RR} \cdot C_{II}}\right)$$

wherein Restraint is a restraint multiplier analogous to the slope setting of traditional differential techniques for adjusting the sensitivity of the relay. A value of 1 is recommended for this parameter for most applications. Raising the restraint multiplier corresponds statistically to demanding a greater confidence interval and has the effect of decreasing sensitivity. Lowering the restraint multiplier is equivalent to relaxing the confidence interval and increases sensitivity. Thus, the restraint multiplier is an application adjustment that is used to achieve the desired balance between sensitivity and security.

Equation 36 is based on the covariance matrix and provides an elliptical restraint characteristic. When the covariance of the current measurements is small, the restraint region shrinks. When the covariance increases, the restraint region grows to reflect the uncertainty of the measurement. The calculated severity increases with the probability that the sum of the measured currents indicates a fault.

The second term of the severity equation arises from the orientation of the ellipse. The equation provides an adaptive elliptical restraint characteristic with the size, shape, and orientation of the ellipse adapting to power system conditions. The calculated severity is zero when the operate phasor is on the elliptical boundary, is negative inside the boundary, and is positive outside the boundary. Outside of the restraint boundary, the computed severity grows as a square of the fault current. The restraint area grows as the square of the error in the measurements.

The severity equation can optionally be filtered using, for example, a single pole low pass filter having a time constant of several cycles. Such a filter can improve accuracy for high impedance faults.

On-line error estimation in power system measurements

Although on-line error estimation is discussed herein in the context of multi-terminal transmission lines, other applications in which the invention can be useful include, for example, motor protection, control and diagnostic devices such as turn fault detectors, power system relays such as distance, transformer, bus, and generator relays, industrial protective devices, and drive systems.

To determine the uncertainty in fundamental power system frequency measurements of voltages and currents, the errors on-line are estimated from available information in a way that tracks the time varying nature of the errors. Furthermore, bad samples are rejected in the case of an occasional fault in the digital sampling electronics. The technique is widely applicable and can be used anywhere fundamental power system measurements are made, including control, protection, and monitoring devices such as relays, meters, drive systems, and circuit breakers, for example.

The method characterizes the uncertainty in a phasor estimate of a fundamental frequency voltage or current with a two variable Gaussian probability distribution with a time varying covariance matrix. This is a good approximation to the net effect of various sources of error even if individual sources are not, strictly speaking, Gaussian. The covariance matrix is calculated for each source of error. Then, the net covariance matrix is calculated by adding the matrices for all sources. The net covariance matrix can be used to characterize the uncertainty in the calculation of any parameter that is derived from voltages or currents.

Typical sources of error include power system noise, transients, line charging current, current sensor gain, phase and saturation error, clock error, and asynchronous sampling. In some situations, some types of errors, such as errors in the phase angle response of sensors and errors due to asynchronous sampling, can be driven to zero by other means. For errors that cannot be controlled, a covariance matrix is calculated for each source of error for each phase. A total covariance matrix is calculated for each phase by adding the matrices form each source. The invention treats various sources of errors as follows.

The system calculates the covariance matrix for errors caused by power system noise, harmonics, and transients. These errors arise because power system currents are not always exactly sinusoidal. The intensity of these errors varies with time, growing during fault conditions, switching operations, or load variations, for example. The system treats these errors as a Gaussian distribution in the real and in the imaginary part of each phasor, with a standard deviation that is estimated from the sum of the squares of the differences between the data samples and the sine function that is used to fit them. This error has a spectrum of frequencies. Current transformer saturation is included with noise and transient error.

For current differential analysis, the preferred method for calculating the covariance matrix for noise, harmonics, transients, and current transformer saturation is from phaselets. The sum of the squares of the errors in the data samples is calculated from the sum of the squares information, phaselets, and phasor for each phase for each terminal at each time step n using equation 32. The covariance matrix is then calculated as a function of the time index and window size using equation 34.

This covariance matrix is calculated separately for each phase of each terminal. Total covariance for a phase due to this source of error is the sum of the covariance matrices from each terminal for that phase.

Another source of error is a 60 Hz component of error current associated with line charging. This error current results from the charge that must be supplied to the capacitance of the transmission line. The amount of charging current, Icharge, increases with the length of the transmission line. This source of error should be evaluated in situations wherein the charging current has not been previously factored out. The fixed covariance matrix for line charging is as follows:

$$\begin{bmatrix} C_{RR(n)} & C_{RI(n)} \\ C_{IR(n)} & C_{II(n)} \end{bmatrix} = \frac{I\text{charge}^2}{9} \cdot \left(\begin{bmatrix} 1 & 0 \\ 0 & 1 \end{bmatrix}\right). \tag{37}$$

Another source of error is the current sensors themselves. These errors are characterized by gain and phase angle errors as a function of the measured current. The covariance matrix due to phase angle error is calculated as follows:

$$\begin{bmatrix} C_{RR(n)} & C_{RI(n)} \\ C_{IR(n)} & C_{II(n)} \end{bmatrix} = \frac{\Delta\phi^2}{9} \cdot \tag{38}$$

-continued $$\left(\left[\begin{array}{cc} \text{PhasorImaginary}_n^2 & -\text{PhasorReal}_n \cdot \text{PhasorImaginary}_n \\ -\text{PhasorReal}_n \cdot \text{PhasorImaginary}_n & \text{PhasorReal}_n^2 \end{array}\right]\right)^2$$

wherein $\Delta\phi$ is the maximum residual phase error (a design constant of a respective current sensor). The total covariance matrix for this source of error for each phase is the sum of the covariance matrices for each terminal for that phase. The imaginary component of the current phasor contributes to the real component of the covariance matrix and vice versa because a phase angle error causes an error in a phasor that is perpendicular to the phasor.

The covariance matrix due to the sensor gain error can be calculated as follows:

$$\left[\begin{array}{cc} C_{RR(n)} & C_{RI(n)} \\ C_{IR(n)} & C_{II(n)} \end{array}\right] = \frac{\Delta g^2}{9} \cdot \tag{39}$$

$$\left(\left[\begin{array}{cc} \text{PhasorImaginary}_n^2 & \text{PhasorReal}_n \cdot \text{PhasorImaginary}_n \\ \text{PhasorReal}_n \cdot \text{PhasorImaginary}_n & \text{PhasorReal}_n^2 \end{array}\right]\right)^2$$

wherein $\Delta g$ is the maximum residual gain error (a design constant of a respective current sensor).

If the maximum residual phase and gain errors are approximately equal, the net covariance matrix for the phase and gain errors can be written as $$\left[\begin{array}{cc} C_{RR(n)} & C_{RI(n)} \\ C_{IR(n)} & C_{II(n)} \end{array}\right] = \frac{\Delta^2}{9} \cdot \tag{39a}$$

$$\left(\left[\begin{array}{cc} \text{PhasorReal}_n^2 + \text{PhasorImaginary}_n^2 & 0 \\ 0 & \text{PhasorReal}_n^2 + \text{PhasorImaginary}_n^2 \end{array}\right]\right)^2$$

wherein $\Delta$ is the maximum residual error.

To provide a restraint boundary that is equivalent to a conventional characteristic relating to phase and gain errors, such as a single slope percentage restraint characteristic, the number of terminals must be taken into account when computing covariance parameters for each terminals. The matrix can be written as follows:

$$\left[\begin{array}{cc} C_{RR(n)} & C_{RI(n)} \\ C_{IR(n)} & C_{II(n)} \end{array}\right] = \frac{\text{slope}^2}{18 \cdot \text{terminals}} \cdot \tag{39b}$$

$$\left(\left[\begin{array}{cc} \text{PhasorReal}_n^2 + \text{PhasorImaginary}_n^2 & 0 \\ 0 & \text{PhasorReal}_n^2 + \text{PhasorImaginary}_n^2 \end{array}\right]\right),$$

wherein slope represents the conventional percentage slope setting, and terminals represents the number of terminals in the system.

If a dual slope restraint is used, the covariance parameters due to phase and gain errors can be calculated using the following technique. First the absolute value of the phasor (PhasorAbs) is calculated:

$$\text{PhasorAbs} = \sqrt{\text{PhasorReal}^2 + \text{PhasorImaginary}^2} . \tag{39c}$$

If PhasorAbs is less than the current at which the slope changes (Current1), then the matrix is calculated as follows:

$$\left[\begin{array}{cc} C_{RR(n)} & C_{RI(n)} \\ C_{IR(n)} & C_{II(n)} \end{array}\right] = \frac{\text{slope1}^2}{18 \cdot \text{terminals}} \cdot \tag{39d}$$

$$\left(\left[\begin{array}{cc} \text{PhasorAbs}^2 & 0 \\ 0 & \text{PhasorAbs}^2 \end{array}\right]\right),$$

wherein slope1 is the slope of the dual slope restraint for currents less than Current1 .

If PhasorAbs is greater than or equal to Current1, then the matrix is calculated as follows:

$$C_{RI(n)} = C_{IR(n)} = 0, \text{ and} \tag{39e}$$

$$C_{RR(n)} = C_{II(n)} = \frac{(\text{slope1} \cdot \text{Current1} + \text{slope2} \cdot (\text{PhasorAbs} - \text{Current1}))^2}{18 \cdot \text{terminals}},$$

wherein slope2 is the slope of the dual slope restraint for current greater than or equal to Current1.

Another potential source of error is caused by asynchronous sampling. This is a small error that arises in the computation of phasors if the number of data samples per cycle at the power system frequency is not exactly an integer. This error can be avoided by synchronizing sampling to the power system frequency, as discussed above.

When the each of the covariance matrices are added, the total covariance matrix defines an elliptical restraint region and can be used in the fault severity equation 36.

Transformer Protection

Figure 6:
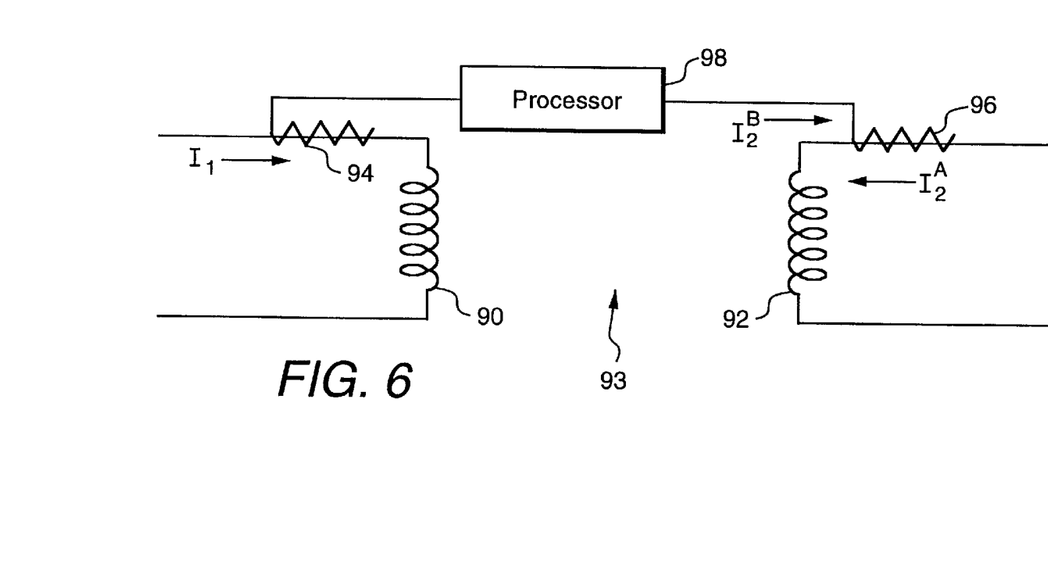
FIG. 6 is a block diagram of a transformer protection embodiment of the present invention.

FIG. 6 is a circuit diagram of a transformer having windings 90 and 92 with respective current sensors 94 and 96 providing current data to a processor 98. Current in the primarily winding in the direction of a coupling region 93 is represented by $I_1$ and current in the secondary winding in the direction of the coupling region is represented by $I_2^A$. Current in the secondary winding in the direction away from the coupling region is represented by $I_2^B$ wherein $I_2^A = -I_2^B$.

A single phase embodiment is shown for purposes of example only; typically a three phase transformer will be used. Furthermore, although a two winding transformer is shown, other types of multi-winding transformers can also be used. Differential transformer protection techniques rely on the fact that under normal conditions the sum over all windings of the ampere turns for each winding equals the magnetizing current of a transformer (usually a small quantity). Because the sum is not identically zero, a restraint signal is needed.

Differential protection schemes work by comparing an operate signal with a restraint signal. In the present method the operate signal is derived from a difference in negative sequence currents in the primary and the secondary windings of the transformer being protected. The restraint signal is based on an on-line calculation of the sources of measurement error. In an adaptive procedure, as discussed above, the restraint region is an ellipse with variable major axis, minor axis, and orientation. Parameters of the ellipse vary with time to make best use of the accuracy of current measurements.

As discussed with respect to the transmission line above, phase currents at each winding can be measured, and decaying offsets can be removed by the technique discussed with respect to equation 24. Then phaselets can be calculated as discussed with respect to equations 25–27 and phasors can be calculated as discussed with respect to equations 28–29 or 20–23.

In one embodiment, a learning stage includes the method described in commonly assigned Premerlani et al., U.S.

application Ser. No. 08/617,718, filed Apr. 1, 1996, wherein a function for a residual injected negative sequence current dependent upon a positive sequence voltage phasor and a positive sequence current phasor is determined by using a symmetrical component transform of fundamental phasors to obtain symmetrical component current and voltage phasors. A learning residual current can be measured, for example, by subtracting a negative sequence current phasor of the primary winding from a negative sequence current of the secondary winding, and corresponding values of the positive sequence voltage and current can be monitored to determine the function. The positive sequence voltage and current of either of the two windings can be monitored.

During operation in a protection stage, the protection residual current can also be determined by calculating and subtracting a negative sequence current phasor of one winding in the direction away from coupling region 93 from a negative sequence current phasor of the other winding in the direction of the coupling region (or, equivalently, adding the two negative sequence current phasors in the direction of the coupling region). A corresponding learning residual current phasor can be subtracted from the protection residual current phasor with the resulting phasor being used below in comparison with the elliptical restraint region.

When transformers having more than two windings are used, the protection residual current can be determined by adding all the negative sequence current phasors in the direction of coupling region 93.

During operation, phaselet sums can be determined from current samples at each winding, and the elliptical restraint region from sources of measurement error can be calculated using the above equations 34 and 37–39 relating to the covariance matrix, thus effectively applying total harmonic restraint for inrush and overexcitation in transformer protection. If the resulting phasor falls within the restraint region, no fault is present. If the resulting phasor falls outside the restraint region, a fault is present. In the unlikely event that the resulting phasor falls on the very thin boundary of the restraint region, whether a fault is present is uncertain. A fault can arbitrarily be declared in this situation. If a fault is present or declared, a filter process can be used to determine whether to trip the circuit.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method of detecting faults on a power transmission line system including a plurality of transmission terminals, the method including:

simultaneously measuring phase current samples at each phase of each transmission terminal;

calculating real and imaginary phaselets comprising partial sums of the phase current samples;

for each phaselet, calculating a respective partial sum of squares of each phase current sample;

calculating the sums of the real and imaginary phaselets over a variable size sliding sample window;

calculating real and imaginary phasor components from the phaselets over the sample window;

calculating a sum of the partial sums of the squares over the sample window;

using the sums of the real and imaginary phaselets, the real and imaginary phasor components, and the sum of the partial sums of the squares to calculate a sum of squares of errors between the phase current samples and a fitted sine wave representative of the real and imaginary phasor components;

using the sum of squares of errors to calculate a variance matrix defining an elliptical uncertainty region;

determining whether a disturbance has occurred, and, if so, re-initializing the sample window; and determining whether a sum of current phasors from each terminal for a respective phase falls outside of the elliptical uncertainty region for the respective phase.

2. The method of claim 1, further including removing decaying offsets from the measured phase current samples prior to the steps of calculating real and imaginary phaselets and calculating the respective partial sum of squares of each phase current sample.

3. The method of claim 2, wherein the step of determining whether a disturbance has occurred includes monitoring at least one of the sum of squares of errors; a magnitude of a positive sequence current, a negative sequence current, or a ground current; a change in a positive, a negative, or a zero sequence current; or a change in load current.

4. The method of claim 2, wherein the step of using the sums of the real and imaginary phaselets, the real and imaginary phasor components, and the sum of the partial sums of the squares to calculate the sum of squares of errors between the phase current samples and the fitted sine wave representative of the real and imaginary phasor components comprises subtracting from the sum of the partial sums of the squares, the product of the real phasor component and the sum of the real phaselets and the product of the imaginary phasor component and the sum of the imaginary phaselets.

5. The method of claim 2, wherein the step of simultaneously measuring phase current samples at each phase of each transmission terminal comprises:

determining a positive sequence current sample at each terminal from the phase current samples;

determining necessary phase angle corrections from the positive sequence current samples; and filtering phase angles to slowly adjust a sampling clock at each respective terminal.

6. The method of claim 2, wherein the variance matrix comprises the following equation:

$$\begin{bmatrix} C_{RR(n,W)} & C_{RI(n,W)} \\ C_{IR(n,W)} & C_{II(n,W)} \end{bmatrix} = \frac{E_n^2}{W} \cdot \left( \begin{bmatrix} T_{RR(n,W)} & T_{RI(n,W)} \\ T_{IR(n,W)} & T_{II(n,W)} \end{bmatrix} \right)$$

wherein $C_{RR}$ represents an expected value of a square of an error in the real phasor component, $C_{RI}$ and $C_{IR}$ represent an expected value of a product of errors in the real and imaginary phasor components, $C_{II}$ represents an expected value of a square of an error in the imaginary phasor component, $E_n^2$ represents the sum of squares of errors, W represents a number of samples in the sample window, n represents a phasor index, and $T_{RR(n,W)}$, $T_{RI(n,W)}$, $T_{IR(n,W)}$, and $T_{II(n,W)}$ represent a phaselet transformation matrix.

7. The method of claim 6, wherein the step of determining whether a sum of current phasors falls outside of the elliptical uncertainty region includes determining a fault severity using the following equation:

$$\text{Severity} = \text{PhasorReal}^2 \cdot \sqrt{\frac{C_{II}}{C_{RR}}} -$$
$$\text{PhasorReal} \cdot \text{PhasorImaginary} \cdot 2 \cdot \frac{C_{RI}}{\sqrt{C_{RR} \cdot C_{II}}} +$$
$$\text{PhasorImaginary}^2 \cdot \sqrt{\frac{C_{RR}}{C_{II}}} -$$
$$18 \cdot \text{Restraint}^2 \cdot \sqrt{C_{RR} \cdot C_{II}} \cdot \left(1 - \frac{C_{RI}^2}{C_{RR} \cdot C_{II}}\right),$$

wherein Restraint is a predetermined restraint multiplier, filtering the severity, and tripping a circuit breaker of the power transmission line if a filtered severity is greater than zero.

8. The method of claim 7, wherein the step of calculating the variance matrix further includes adding the following three matrices $$\frac{\text{Icharge}^2}{9} \cdot \left( \begin{bmatrix} 1 & 0 \\ 0 & 1 \end{bmatrix} \right),$$

$$\frac{\Delta\phi^2}{9} \cdot \left( \begin{bmatrix} \text{PhasorImaginary}_n^2 & -\text{PhasorReal}_n \cdot \text{PhasorImaginary}_n \\ -\text{PhasorReal}_n \cdot \text{PhasorImaginary}_n & \text{PhasorReal}_n^2 \end{bmatrix} \right), \text{ and}$$

$$\frac{\Delta g^2}{9} \cdot \left( \begin{bmatrix} \text{PhasorImaginary}_n^2 & \text{PhasorReal}_n \cdot \text{PhasorImaginary}_n \\ \text{PhasorReal}_n \cdot \text{PhasorImaginary}_n & \text{PhasorReal}_n^2 \end{bmatrix} \right),$$

to the $$\frac{E_n^2}{W} \cdot \left( \begin{bmatrix} T_{RR(n,W)} & T_{RI(n,W)} \\ T_{IR(n,W)} & T_{II(n,W)} \end{bmatrix} \right)$$

matrix wherein Icharge represents a charging current, $\Delta\phi$ represents a maximum residual phase error, and $\Delta g$ represents a maximum residual gain error.

9. A method of detecting faults on a power transmission line system including a plurality of transmission terminals, the method including:

simultaneously measuring phase current samples at each phase of each transmission terminal;

calculating real and imaginary phaselets comprising partial sums of the phase current samples;

for each phaselet, calculating a respective partial sum of squares of each phase current sample;

calculating the sums of the real and imaginary phaselets over a variable size sliding sample window;

calculating real and imaginary phasor components from the phaselets over the sample window;

calculating a sum of the partial sums of the squares over the sample window;

using the sums of the real and imaginary phaselets, the real and imaginary phasor components, and the sum of the partial sums of the squares to calculate, for each phase, a sum of squares of errors between the phase current samples and a fitted sine wave representative of the real and imaginary phasor components;

for each terminal,
calculating sequence current phasors from the phase current samples;
calculating a sequence sums of squares of the errors from the sums of squares of errors;

using the sequence sums of squares of errors to calculate a sequence variance matrix defining an elliptical uncertainty region;

transmitting the sequence current phasors and the sequence variance matrix to a remote location; and at the remote location,
determining whether a disturbance has occurred, and, if so, re-initializing the sample window; and
determining whether any of the sequence current phasors falls outside the elliptical uncertainty region.

10. A method of detecting faults on a transformer, the method comprising:

measuring phase current samples at each of a plurality of transformer windings;

calculating real and imaginary phaselets comprising partial sums of the phase current samples;

for each phaselet, calculating a respective partial sum of the squares of each phase current sample of the each phaselet;

calculating the sums of the real and imaginary phaselets over a variable size sliding sample window;

calculating real and imaginary phasor components from the phaselets over the sample window;

calculating a sum of the partial sums of the squares over the sample window;

using the sums of the real and imaginary phaselets, the real and imaginary phasor components, and the sum of the partial sums of the squares to calculate a sum of squares of errors between the phase current samples and a fitted sine wave representative of the real and imaginary phasor components;

using the sum of squares of errors to calculate a variance matrix defining an elliptical uncertainty region;

applying a symmetrical component transform to the real and imaginary phasor components to obtain symmetrical component current phasors including a negative sequence current phasor for each of the transformer windings;

determining a baseline residual current phasor;

adding the negative sequence current phasors of the transformer windings in the direction of a coupling region to obtain a calculated residual current phasor;

subtracting the baseline residual current phasor from the calculated residual current phasor to obtain a resulting phasor; and determining whether the resulting phasor falls outside of the elliptical uncertainty region.

11. The method of claim 10, further including removing decaying offsets from the measured phase current samples prior to the steps of calculating real and imaginary phaselets and calculating the respective partial sum of the squares of each phase current sample.

12. The method of claim 11, wherein the step of determining the baseline residual current phasor comprises, prior to measuring the phase current samples at each of the transformer windings, determining a function for the baseline residual current by:

measuring initial phase current samples at each of the transformer windings;

calculating initial real and imaginary phaselets comprising partial sums of the initial phase current samples;

calculating initial real and imaginary phasor components from the initial phaselets over the sample window;

applying a symmetrical component transform to the initial real and imaginary phasor components to obtain initial symmetrical component current phasors including an initial negative sequence current phasor for each transformer winding;

adding the initial negative sequence current phasors of the transformer windings in the direction of the coupling region to obtain an initial respective baseline residual current phasor.

13. The method of claim 12, further including:

prior to measuring the phase current samples at each of the transformer windings:

measuring initial phase voltage samples of the at least one of the transformer windings;

removing decaying offsets form the initial measured phase voltage samples to provide initial phase voltage samples;

calculating initial real and imaginary voltage phasor components from the initial phase voltage samples over the sample window;

applying a symmetrical component transform to the initial real and imaginary voltage phasor components to obtain an initial positive sequence voltage phasor, wherein the step of applying a symmetrical component transform to the initial real and imaginary phasor components to obtain initial symmetrical component current phasors includes obtaining an initial positive sequence current phasor, the initial positive sequence voltage phasor and the initial positive sequence current phasors corresponding to a respective baseline residual current phasor; and while measuring the phase current samples at each of the transformer windings:

measuring phase voltage samples of at least one of the transformer windings;

calculating real and imaginary voltage phasors from the phase voltage samples over the sample window;

applying a symmetrical component transform to the real and imaginary voltage phasor components to obtain a positive sequence voltage phasor, wherein the step of applying a symmetrical component transform to the real and imaginary phasor components to obtain symmetrical component current phasors includes obtaining a positive sequence current phasor; and wherein the step of determining the baseline residual current phasor further comprises using the positive sequence voltage phasor and the positive sequence current phasor to determine a corresponding baseline residual current phasor.

14. The method of claim 12, wherein the step of using the sums of the real and imaginary phaselets, the real and imaginary phasor components, and the sum of the partial sums of the squares to calculate the sum of squares of errors between the phase current samples and the fitted sine wave representative of the real and imaginary phasor components comprises subtracting from the sum of the partial sums of the squares, the product of the real phasor component and the sum of the real phaselets and the product of the imaginary phasor component and the sum of the imaginary phaselets.

15. The method of claim 14, wherein the variance matrix comprises the following equation:

$$\begin{bmatrix} C_{RR(n,W)} & C_{RI(n,W)} \\ C_{IR(n,W)} & C_{II(n,W)} \end{bmatrix} = \frac{E_n^2}{W} \cdot \left( \begin{bmatrix} T_{RR(n,W)} & T_{RI(n,W)} \\ T_{IR(n,W)} & T_{II(n,W)} \end{bmatrix} \right)$$

wherein $C_{RR}$ represents an expected value of a square of an error in the real phasor component, $C_{RI}$ and $C_{IR}$ represent an expected value of a product of errors in the real and imaginary phasor components, $C_{II}$ represents an expected value of a square of an error in the imaginary phasor component, $E_n^2$ represents the sum of squares of errors, W represents a number of samples in the sample window, n represents a phasor index, and $T_{RR(n,W)}$, $T_{RI(n,W)}$, $T_{IR(n,W)}$, and $T_{II(n,W)}$ represent a phaselet transformation matrix.

16. A system for detecting faults on a power transmission line system including a plurality of transmission terminals, the system including:

current sensors for simultaneously measuring phase current samples at each phase of each transmission terminal; and a computer for calculating real and imaginary phaselets comprising partial sums of the phase current samples;

for each phaselet, calculating a respective partial sum of squares of each phase current sample;

calculating the sums of the real and imaginary phaselets over a variable size sliding sample window;

calculating real and imaginary phasor components from the phaselets over the sample window;

calculating a sum of the partial sums of the squares over the sample window;

using the sums of the real and imaginary phaselets, the real and imaginary phasor components, and the sum of the partial sums of the squares to calculate a sum of squares of errors between the phase current samples and a fitted sine wave representative of the real and imaginary phasor components;

using the sum of squares of errors to calculate a variance matrix defining an elliptical uncertainty region;

determining whether a disturbance has occurred, and, if so, re-initializing the sample window; and determining whether a sum of current phasors from each terminal for a respective phase falls outside of the elliptical uncertainty region for the respective phase.

17. The system of claim 16, wherein the computer includes means for enabling simultaneous measurements of the current sensors by:

determining a positive sequence current sample at each terminal from the phase current samples;

determining necessary phase angle corrections from the positive sequence current samples; and filtering phase angles to slowly adjust a sampling clock at each respective terminal.

18. A system for detecting faults on a power transmission line system including a plurality of transmission terminals, the system including:

current sensors for simultaneously measuring phase current samples at each phase of each transmission terminal; and a computer for calculating real and imaginary phaselets comprising partial sums of the phase current samples;

for each phaselet, calculating a respective partial sum of squares of each phase current sample;

calculating the sums of the real and imaginary phaselets over a variable size sliding sample window;

calculating real and imaginary phasor components from the phaselets over the sample window;

calculating a sum of the partial sums of the squares over the sample window;

using the sums of the real and imaginary phaselets, the real and imaginary phasor components, and the sum of the partial sums of the squares to calculate, for each phase, a sum of squares of errors between the phase current samples and a fitted sine wave representative of the real and imaginary phasor components;

for each terminal,
calculating sequence current phasors from the phase current samples;
calculating a sequence sums of squares of the errors from the sums of squares of errors;
using the sequence sums of squares of errors to calculate a sequence variance matrix defining an elliptical uncertainty region;

transmitting the sequence current phasors and the sequence variance matrix to a remote location; and at the remote location,
determining whether a disturbance has occurred, and, if so, re-initializing the sample window; and
determining whether any of the sequence current phasors falls outside the elliptical uncertainty region.

19. A system for detecting faults on a transformer, the system comprising:

current sensors for measuring phase current samples at each of a plurality of transformer windings; and a computer for calculating real and imaginary phaselets comprising partial sums of the phase current samples;

for each phaselet, calculating a respective partial sum of the squares of each phase current sample of the each phaselet;

calculating the sums of the real and imaginary phaselets over a variable size sliding sample window;

calculating real and imaginary phasor components from the phaselets over the sample window;

calculating a sum of the partial sums of the squares over the sample window;

using the sums of the real and imaginary phaselets, the real and imaginary phasor components, and the sum of the partial sums of the squares to calculate a sum of squares of errors between the phase current samples and a fitted sine wave representative of the real and imaginary phasor components;

using the sum of squares of errors to calculate a variance matrix defining an elliptical uncertainty region;

applying a symmetrical component transform to the real and imaginary phasor components to obtain symmetrical component current phasors including a negative sequence current phasor for each of the transformer windings;

determining a baseline residual current phasor;

adding the negative sequence current phasors of the transformer windings in the direction of a coupling region to obtain a calculated residual current phasor;

subtracting the baseline residual current phasor from the calculated residual current phasor to obtain a resulting phasor; and determining whether the resulting phasor falls outside of the elliptical uncertainty region.

* * * * *